(12) United States Patent
Aritome

(10) Patent No.: US 7,580,287 B2
(45) Date of Patent: Aug. 25, 2009

(54) PROGRAM AND READ TRIM SETTING

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 358 days.

(21) Appl. No.: 11/218,851

(22) Filed: Sep. 1, 2005

(65) Prior Publication Data

US 2007/0047315 A1 Mar. 1, 2007

(51) Int. Cl.
*G11C 11/34* (2006.01)

(52) U.S. Cl. .................. 365/185.18; 365/185.14; 717/120

(58) Field of Classification Search ........... 365/185.18, 365/185.14, 185.28, 185.08, 185.17
See application file for complete search history.

(56) References Cited

U.S. PATENT DOCUMENTS

| | | | |
|---|---|---|---|
| 5,172,388 A | 12/1992 | Mehrotra et al. | |
| 5,293,337 A | 3/1994 | Aritome et al. | |
| 5,321,699 A | 6/1994 | Endoh et al. | |
| 5,361,227 A | 11/1994 | Tanaka et al. | |
| 5,386,442 A | 1/1995 | Diaz et al. | |
| 5,402,373 A | 3/1995 | Aritome et al. | |
| 5,453,668 A * | 9/1995 | Chow .................. | 315/307 |
| 5,469,444 A | 11/1995 | Endoh et al. | |
| 5,528,547 A | 6/1996 | Aritome et al. | |
| 5,546,351 A | 8/1996 | Tanaka et al. | |
| 5,555,204 A | 9/1996 | Endoh et al. | |
| 5,602,789 A | 2/1997 | Endoh et al. | |
| 5,615,165 A | 3/1997 | Tanaka et al. | |
| 5,724,300 A | 3/1998 | Tanaka et al. | |
| 5,774,397 A | 6/1998 | Endoh et al. | |
| 5,793,696 A | 8/1998 | Tanaka et al. | |
| 5,818,791 A | 10/1998 | Tanaka et al. | |
| 5,909,399 A | 6/1999 | Tanaka et al. | |
| 5,940,321 A | 8/1999 | Takeuchi et al. | |
| 5,946,231 A | 8/1999 | Endoh et al. | |
| 5,978,265 A | 11/1999 | Kirisawa et al. | |
| 5,995,413 A * | 11/1999 | Holzmann et al. ..... | 365/185.09 |
| 6,014,330 A | 1/2000 | Endoh et al. | |
| 6,023,423 A | 2/2000 | Aritome | |
| 6,046,940 A | 4/2000 | Takeuchi et al. | |
| 6,049,482 A | 4/2000 | Aritome et al. | |
| 6,172,911 B1 | 1/2001 | Tanaka et al. | |
| 6,188,611 B1 | 2/2001 | Endoh et al. | |
| 6,191,975 B1 | 2/2001 | Shimizu et al. | |
| 6,225,933 B1 * | 5/2001 | Salter et al. ................ | 341/144 |
| 6,876,586 B1 * | 4/2005 | Hausmann ............ | 365/189.12 |
| 6,898,119 B2 * | 5/2005 | Imamiya et al. ........ | 365/185.09 |
| 7,057,936 B2 * | 6/2006 | Yaegashi et al. ........ | 365/185.22 |
| 7,203,119 B2 * | 4/2007 | Lee ........................... | 365/226 |
| 2002/0048191 A1* | 4/2002 | Ikehashi et al. ........ | 365/185.22 |
| 2004/0148482 A1* | 7/2004 | Grundy et al. ............ | 711/167 |
| 2006/0015691 A1* | 1/2006 | Louie et al. ................ | 711/154 |

(Continued)

OTHER PUBLICATIONS

U.S. Appl. No. 11/277,436, Seiichi Aritome, Memory device with variable trim settings.*

*Primary Examiner*—Dang T Nguyen
(74) *Attorney, Agent, or Firm*—Leffert Jay & Polglaze, P.A.

(57) ABSTRACT

A method and apparatus for setting trim parameters in a memory device provides multiple trim settings that are assigned to portions of the memory device according to observed or tested programming speed and reliability.

36 Claims, 5 Drawing Sheets

U.S. PATENT DOCUMENTS

2006/0256620 A1* 11/2006 Nguyen et al. ......... 365/185.28
2006/0274594 A1* 12/2006 Huckaby et al. ............ 365/226
2007/0223278 A1* 9/2007 Aritome ................ 365/185.11

* cited by examiner

PROGRAM AND READ TRIM SETTING

FIELD

The present invention relates generally to memory devices and in particular the present invention relates to flash memory devices.

BACKGROUND

In conventional memory programming, such as NAND or other flash programming trim setting methods, program trim information is stored in a peripheral area. Further, only one trim set is used and applied to on die, that is to all blocks and all word lines of the NAND device. However, in the case of pitch doubling pattering technology, which is becoming common in NAND devices, the critical dimension differences between even and odd column and row lines is increasing. This is due to decreased uniformity of side wall oxides and etching. A single trim setting is not suitable for all pages for effective trim setting.

For example, certain combinations of active area of the lines on which signals are passing and the gate size of transistors involved in programming or read operations will program or read much more quickly than others. A trim setting suitable for a fast read or program is not necessarily suitable for a slow read or program operation.

For the reasons stated above, and for other reasons stated below which will become apparent to those skilled in the art upon reading and understanding the present specification, there is a need in the art for an improved trim setting method and memory.

SUMMARY

The above-mentioned problems with trim settings in memories and other problems are addressed by the present invention and will be understood by reading and studying the following specification.

In one embodiment, a method of setting trim settings in a memory device includes programming a number of trim settings into a memory, and assigning an appropriate one of the trim settings for each portion of the memory device.

In another embodiment, a method of increasing program reliability in a NAND memory includes identifying a number of portions of the memory, testing a number of trim settings stored in a trim setting register to determine which trim setting is best for the respective portion, and assigning the determined best trim setting to the respective portion.

In yet another embodiment, a trim set register for a memory device includes a number of individual trim settings, each trim setting comprising a program trim value and a step-up trim value.

In still another embodiment, a processing system includes a processor and a memory device coupled to the processor to store data provided by the processor and to provide data to the processor. The memory device includes an array of memory cells, control circuitry to read, write and erase the memory cells, address circuitry to latch address signals provided on address input connections, and a trim set register for a memory device includes a number of individual trim settings.

Other embodiments are described and claimed.

DETAILED DESCRIPTION

Figure 1:
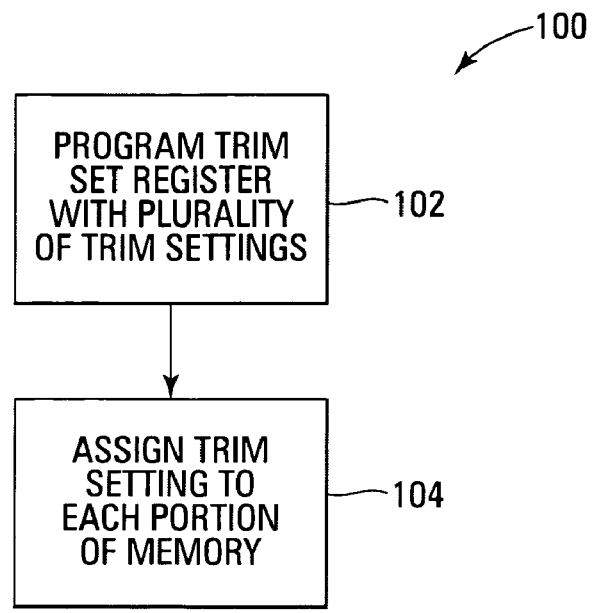
FIG. 1 is a flowchart diagram of a method according to one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Embodiments of the present invention provide trim settings that are used to individualize portions of a memory device or system with a trim setting that allows each portion to be more efficiently and effectively programmed.

Three or four different trim set parameters, stored in a trim set register, allows variations in geometry, programming speed, and the like, to be taken into account. Four trim settings are very effective for improving program speed and program reliability. The settings are assigned in various embodiments per page, block, row, column, partition, or the like. It should be understood that trim settings could be assigned in a register to any portion of a memory device, but space limitations and practicality typically limit the size of the trim set register. A register containing three or four individual trim settings, each having a program voltage, a step-up voltage, and a program pulse width, provides a good compromise between speed, reliability, and space. In another embodiment, the number of trim settings is an exponential value of 2, that is $2^n$, where n is a positive integer. Therefore, the number of trim settings in such an embodiment is 2, 4, 8, 16, 32, . . . )

A method 100 of programming a memory device, such as a NAND memory device, a flash memory device, or the like, is shown in FIG. 1. Method 100 comprises programming a trim set register with a plurality of trim settings in block 102. In one embodiment, the trim settings comprise a program voltage trim setting, a step-up voltage trim setting, and a program pulse width. Further, in another embodiment, the register includes space for storing four individual trim settings, that is four sets of program and step-up voltages. In block 104, the method 100 assigns an appropriate one of the plurality of trim settings for each of a plurality of portions of the memory device. The portions of the memory devices, as described above, can be pages, blocks, columns, rows, groups of columns or rows, partitions and the like.

Figure 2:
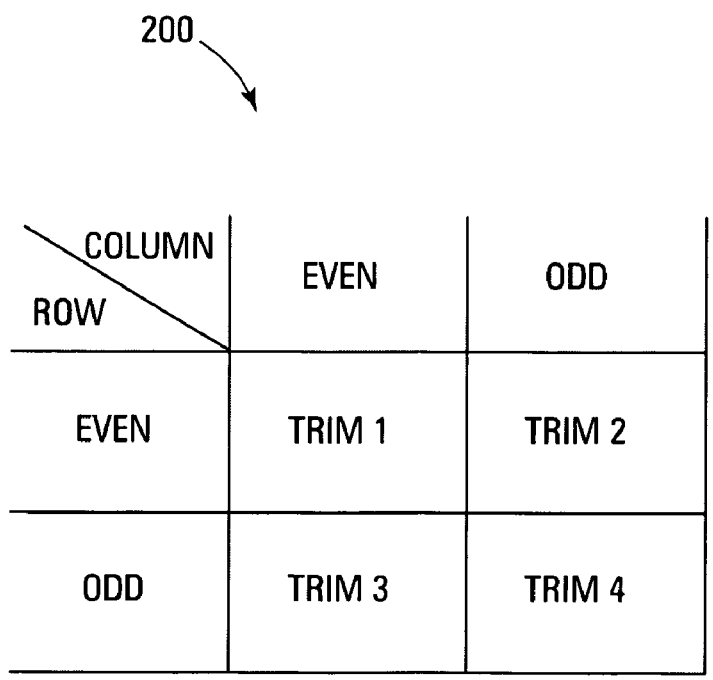
FIG. 2 is a table of trim settings according to another embodiment if the present invention.

In one embodiment 200, the trim settings are assigned to row and column combinations as shown in FIG. 2. The trim settings are identified in one embodiment with even row and even column (trim 1), even row and odd column (trim 2), odd row and even column (trim 3), or odd row and odd column (trim 4). Each trim set is independent and is used for the specific row/column combination. Each trim set has three parameters, a program voltage trim parameter, a step up voltage trim parameter, a program pulse width trim parameter. The four separate trim settings allow for separate settings for faster or slower programming times based on for instance geometry of the lines. Each portion of the memory in this embodiment has different and independent program trim sets. Portions of the memory include by way of example and not by way of limitation pages, blocks, columns, rows, partitions and the like. This method allows for high program performance and high reliability.

In another embodiment, there are three independent trim settings, with the even/odd and odd/even row/column trim settings (trim 2 and trim 3) being equal.

Figure 3:
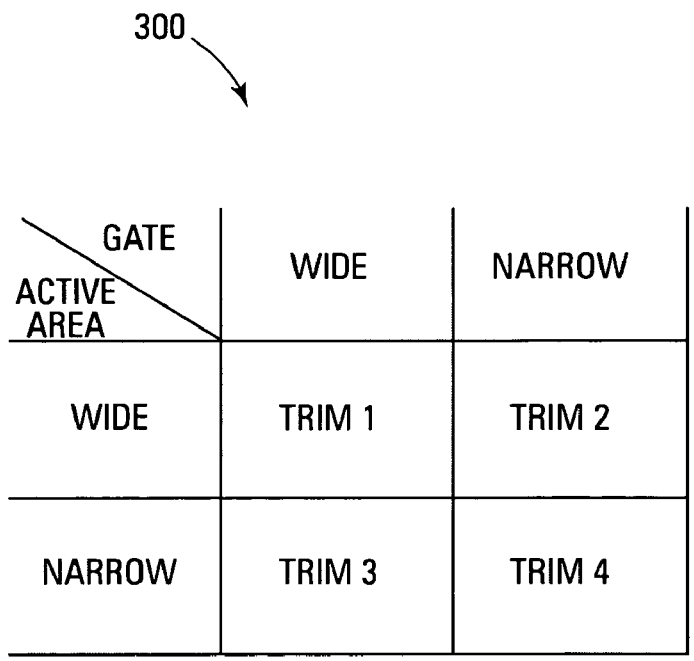
FIG. 3 is a table of trim settings according to another embodiment of the present invention.

In another embodiment 300, the trim settings are assigned to wide and narrow active area and gate configuration combinations as shown in FIG. 3. Another embodiment of the present invention provides trim settings identified with wide active areas for the lines and wide gates for transistors in the portion (trim 1), wide active areas for the lines and narrow gates for transistors in the portion (trim 2), narrow active areas for the lines and wide gates for transistors in the portion (trim 3), and narrow active areas for the lines and narrow gates for transistors in the portion (trim 4). Each trim set is independent and is used for the specific wide/narrow combination. Each trim set has three parameters, a program voltage trim parameter, a step up voltage trim parameter, and a program pulse width trim parameter. The four separate trim settings allow for separate settings for faster or slower programming times based on for instance geometry of the lines. Each page in this embodiment has different and independent program trim sets. Portions of the memory include by way of example and not by way of limitation pages, blocks, columns, rows, partitions and the like.

In another embodiment, there are three independent trim settings, with the wide/narrow and narrow/wide active area/gate trim settings (trim 2 and trim 3) being equal.

Trim settings in a program-verify-read or normal read setting include different parameters, such as a sensing time or sense amplifier delay, a bitline precharge voltage, and a sensing or sense reference voltage. Such settings can be modified or changed to accommodate specific read or verify operations. In another embodiment, a second trim set register is used to store the program-read-verify or normal read trim settings, which are programmed into the second trim set register in a similar fashion as that described above.

In another embodiment, testing is performed for each portion of the memory device, and a trim setting most appropriate for the observed or tested programming speed is used.

Figure 4:
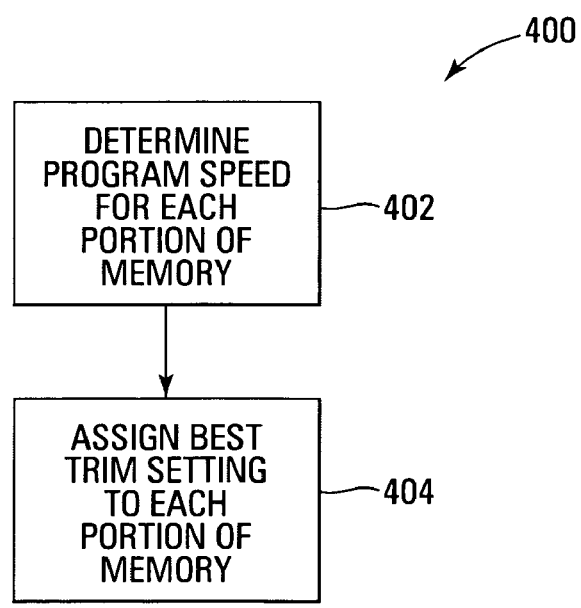
FIG. 4 is a flowchart diagram of method according to still another embodiment of the present invention.

A method 400 of testing a memory device to set trim settings is shown in FIG. 4. Method 400 comprises determining a programming speed for each of a plurality of portions of the memory device in block 402, and assigning a best one of a plurality of trim settings to each of the plurality of portions of the memory device in block 404. In one embodiment, a probe is used to determine the speed and/or reliability of programming for each page, sector, segment, block, partition, row, column, or the like of a part once the part is completed. Individual trim settings for each portion of the memory are assigned in one embodiment from the plurality of trim settings programmed into the register. It should be understood that while a general plurality of trim settings may initially be programmed into the register, it is within the scope of the invention to program the trim set register for each individual part to improve the programming speed and reliability on a part by part basis. The trim settings can be adjusted or reprogrammed into the trim set register depending upon the results of probing. Further, a second trim set register is used in another embodiment to store read-program-verify or normal read trim settings for various configurations. In that embodiment, the trim settings include a sensing time or sense amplifier delay, a bitline precharge voltage, and a sensing or sense reference voltage.

It should further be understood that while typically, a wide/wide combination of active area and gate configuration programs quickly and a narrow/narrow combination of active area and gate configuration programs slowly, due to many factors, including but not limited to geometry, length of lines, method of fabrication and the like, a narrow/narrow active area and gate configuration combination could program quickly, while a wide/wide active area and gate configuration combination could program slowly. Once probing results in a determination of the speed and reliability of a portion of the memory device, the trim settings are adjustable to accommodate differences that are out of the ordinary as well.

It should be understood that while row/column identities are used, some lines even though they are in a pattern do not conform to the conventions described above. Instead, there may be four or more trim settings, of which one can be applied, based on any number of criteria. Further, trim settings can be applied per page, per block, per array, per sector, per partition, or the like without departing from the scope of the invention.

Figure 4A:
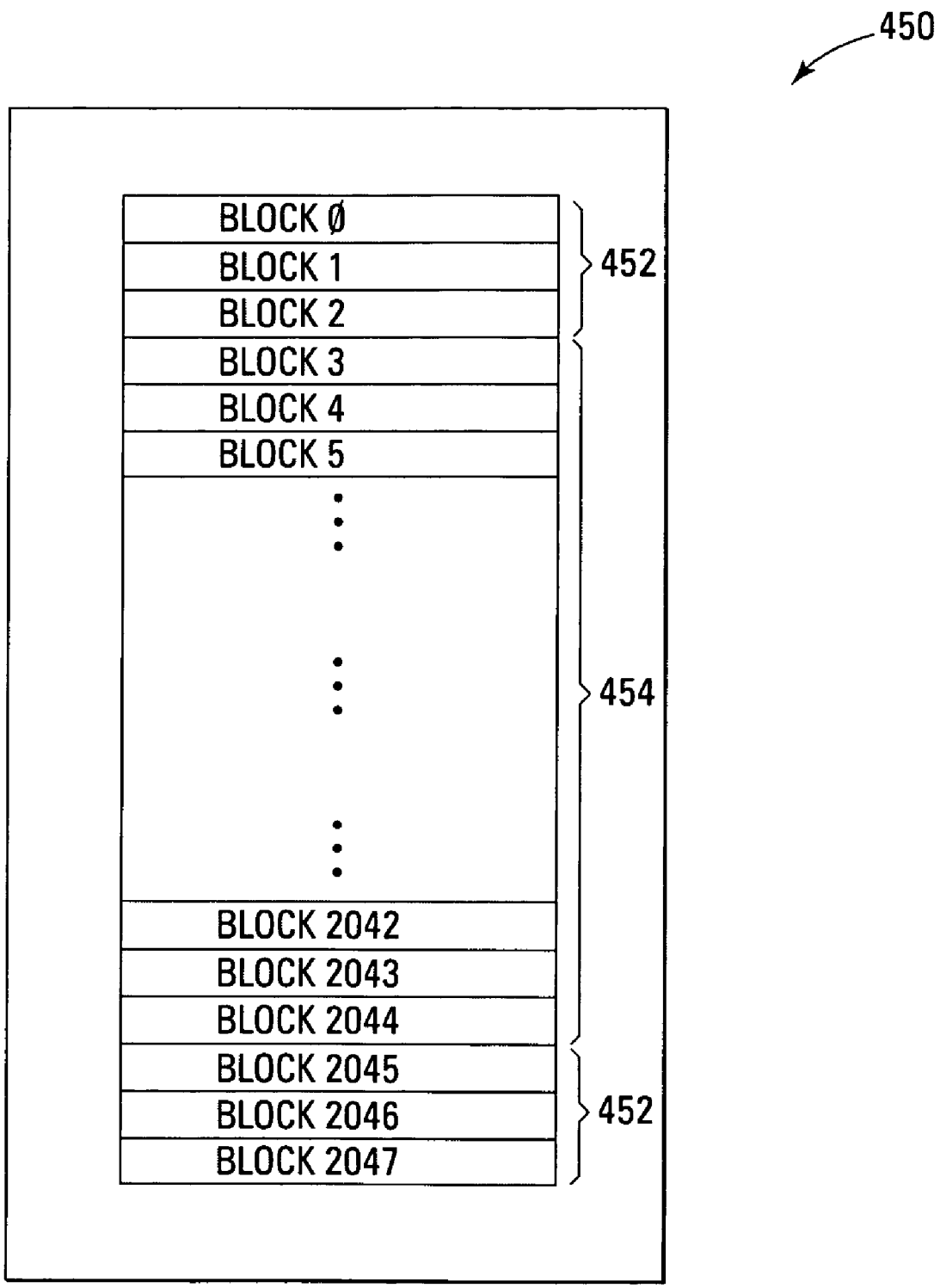
FIG. 4A is a block diagram of another embodiment of the present invention.

FIG. 4A is an embodiment 450 of another array image of possible trim settings in a memory. Array 450 is shown with 2048 blocks. In this embodiment, blocks 452 (labeled as blocks 0, 1, 2, 2045, 2046, and 2047) are edge blocks. Blocks 454 (labeled as blocks 3, 4, 5, . . . , 2042, 2043, and 2044) are center blocks. In this embodiment, edge blocks 452 and center blocks 454 have different trim settings. In this embodiment, the number of different trim settings is two. The trim settings are therefore in this embodiment dependent upon block array location.

Figure 5:
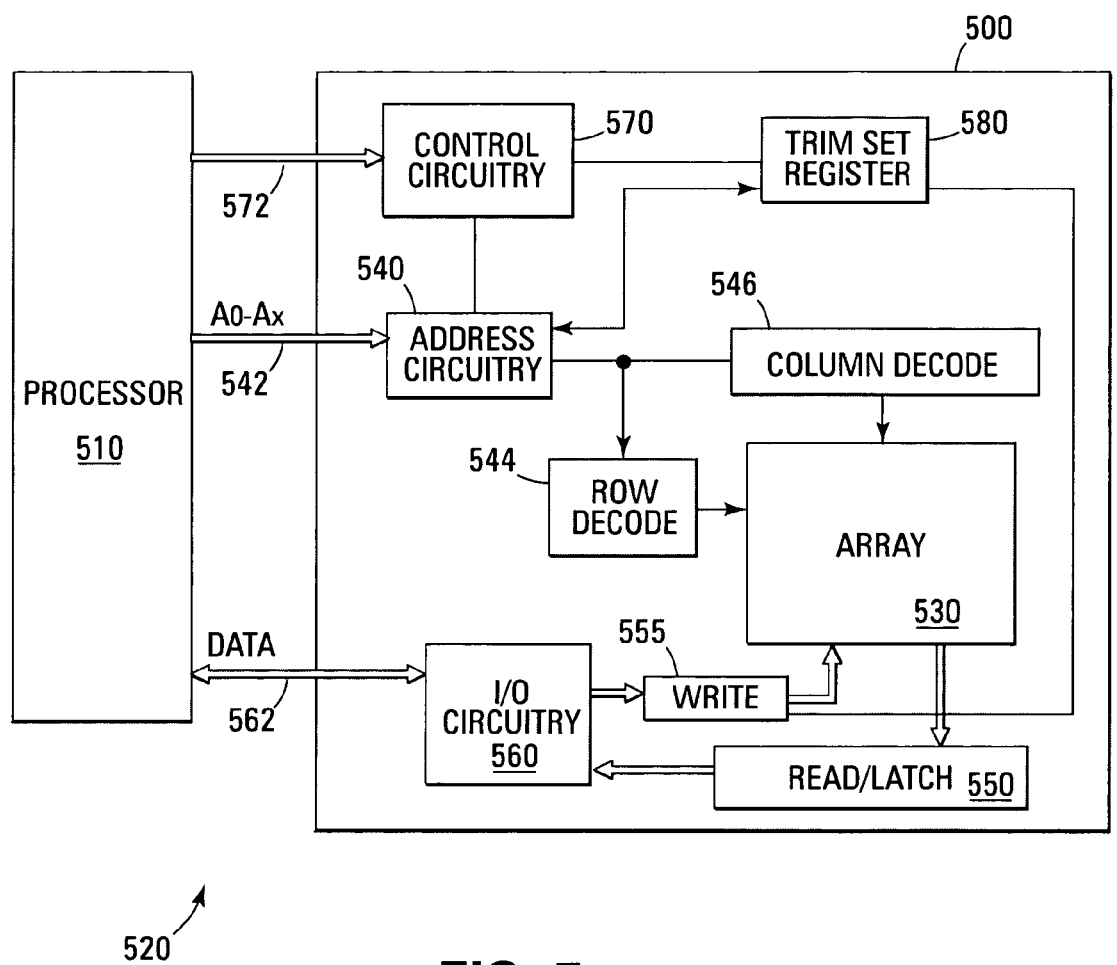
FIG. 5 is a functional block diagram of a memory system having at least one memory device in accordance with an embodiment of the invention.

FIG. 5 is a functional block diagram of a memory device 500, such as a flash memory device, of one embodiment of the present invention, which is coupled to a processor 510. The memory device 500 and the processor 510 may form part of an electronic system 520. The memory device 500 has been simplified to focus on features of the memory that are helpful in understanding the present invention. The memory device includes an array of memory cells 530. The memory array 530 is arranged in banks of rows and columns.

An address buffer circuit 540 is provided to latch address signals provided on address input connections A0-Ax 542. Address signals are received and decoded by row decoder 544 and a column decoder 546 to access the memory array 530. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 530 by sensing voltage or current changes in the memory array columns using sense/latch circuitry 550. The sense/latch circuitry, in one embodiment, is coupled to read and latch a row of data from the memory array. Data input and output buffer circuitry 560 is included for bi-directional data communication over a plurality of data (DQ) connections 562 with the processor 510, and is connected to write circuitry 555 and read/latch circuitry 550 for performing read and write operations on the memory 500.

Command control circuit 570 decodes signals provided on control connections 572 from the processor 510. These signals are used to control the operations on the memory array 530, including data read, data write, and erase operations. A trim set register 580, such as those described above, is programmable with trim settings according to the portions of the memory device 500. The flash memory device has been simplified to facilitate a basic understanding of the features of the memory. A more detailed understanding of internal circuitry and functions of flash memories are known to those skilled in the art.

It should be understood that while a generic memory device is shown, the embodiments of the present invention are amenable to use with many integrated circuits as well as with other memory devices, including but not limited to dynamic random access memory (DRAM), synchronous DRAM, flash memory, and the like.

Figure 6:
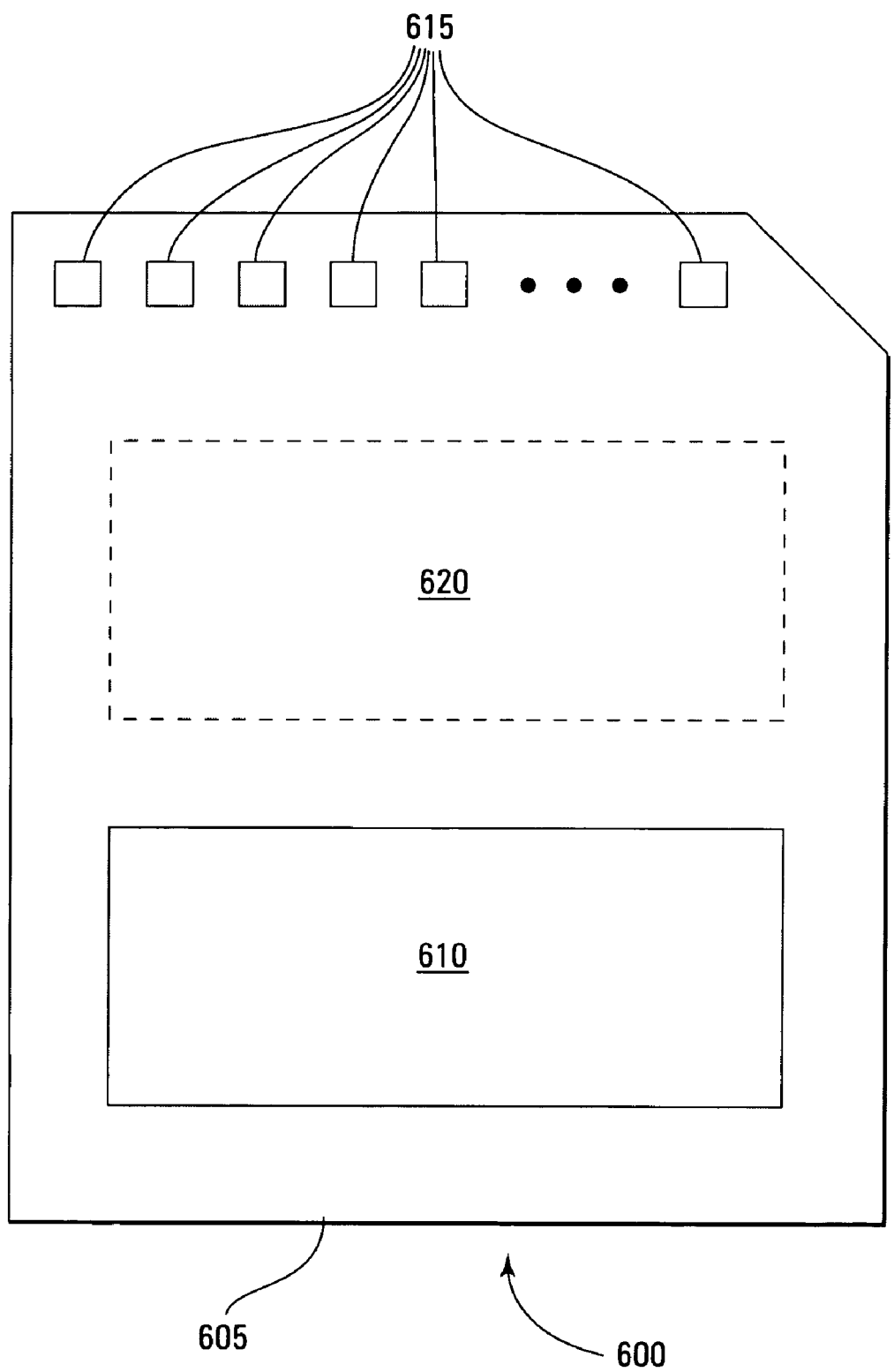
FIG. 6 is a functional block diagram of a memory modules having at least one memory device in accordance with an embodiment of the invention.

FIG. 6 is an illustration of an exemplary memory module 600. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory with a trim set register such as register 580 described above for a plurality of trim settings as described above. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 100 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

A method of setting trim settings, and memory devices and systems using the trim setting method and a trim set register have been described that include a trim set register with a plurality of trim settings to allow a memory or system to have improved reliability and programming speed by tailoring trim settings to individual portions of the memory, such as pages, blocks, partitions, sectors, columns, rows, and the like. The memory device parameters are tested in one embodiment and trim settings applied based on observed programming speed and reliability data.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed:
1. A memory device, comprising:
   an array of memory cells;
   control circuitry to read, write and erase the memory cells;
   address circuitry to latch address signals provided on address input connections; and;
   a trim setting register having a plurality of individual trim settings, each trim setting comprising a program trim value, a step-up trim value, and a program pulse width.
2. The memory device of claim 1, wherein the array is divided into portions, each portion having a trim setting chosen from one of the plurality of trim settings, according to its operational parameters.
3. The memory device of claim 2, wherein each of the portions are pages of the memory device.
4. The memory device of claim 2, wherein each of the portions are blocks of the memory device.
5. The memory device of claim 2, wherein each of the portions are rows of the memory device.
6. The memory device of claim 2, wherein each of the portions are columns of the memory device.

7. The memory device of claim 2, wherein each of the portions are partitions of the memory device.

8. The memory device of claim 1, wherein the plurality of trim settings include trim set parameters for:
   a wide active area and a wide gate;
   a wide active area and a narrow gate;
   a narrow active area and a wide gate; and
   a narrow active area and a narrow gate.

9. The memory device of claim 8, wherein the trim settings for a wide active area and a narrow gate, and for a narrow active area and a wide gate are the same.

10. The memory device of claim 1, wherein the plurality of trim settings include trim parameters for fast programming portions, first intermediate speed programming portions, second intermediate speed programming portions, and slow programming portions.

11. The memory device of claim 10, wherein the trim settings for the first intermediate speed programming portions and the second intermediate speed programming portions are the same.

12. The memory device of claim 1, and further comprising:
   storing the plurality of trim settings in a trim set register having a register entry for each of the trim settings.

13. The memory device of claim 1, wherein the plurality of trim settings include trim set parameters for:
   an even row and an even column;
   an even row and an odd column;
   an odd row and an even column; and
   an odd row and odd column.

14. The memory device of claim 13, wherein the trim settings for an even row and an even column, and for an odd row and an even column, are the same.

15. The memory device of claim 1, and further comprising:
   testing each portion of the memory to determine a program speed; and
   assigning a trim setting from one of the plurality of trim settings to each portion based on its determined program speed.

16. A processing system, comprising:
   a processor; and
   a memory device coupled to the processor to store data provided by the processor and to provide data to the processor, the memory comprising:
   an array of memory cells;
   control circuitry to read, write and erase the memory cells;
   address circuitry to latch address signals provided on address input connections; and
   a trim setting register having a plurality of individual trim settings, each trim setting comprising a program trim value, a step-up trim value, and a program pulse width value.

17. The processing system of claim 16, wherein the array is divided into portions, each portion having a trim setting chosen from one of the plurality of trim settings, according to its operational parameters.

18. The processing system of claim 16, wherein the plurality of trim settings include trim set parameters for:
   a wide active area and a wide gate;
   a wide active area and a narrow gate;
   a narrow active area and a wide gate; and
   a narrow active area and a narrow gate.

19. The processing system of claim 18, wherein the trim settings for a wide active area and a narrow gate, and for a narrow active area and a wide gate are the same.

20. The processing system of claim 16, wherein the plurality of trim settings include trim parameters for fast programming portions, first intermediate speed programming portions, second intermediate speed programming portions, and slow programming portions.

21. The processing system of claim 20, wherein the trim settings for the first intermediate speed programming portions and the second intermediate speed programming portions are the same.

22. The processing system of claim 16, wherein the plurality of trim settings include trim set parameters for:
   an even row and an even column;
   an even row and an odd column;
   an odd row and an even column; and
   an odd row and odd column.

23. The processing system of claim 22, wherein the trim settings for an even row and an even column, and for an odd row and an even column, are the same.

24. The processing system of claim 16, and further comprising:
   testing each portion of the memory to determine a program speed; and
   assigning a trim setting from one of the plurality of trim settings to each portion based on its determined program speed.

25. A memory module, comprising:
   a plurality of contacts; and
   two or more memory devices, each having access lines selectively coupled to the plurality of contacts;
   wherein at least one of the memory devices comprises:
      an array of non-volatile memory cells;
      circuitry for control and/or access of the array of non-volatile memory cells;
      address circuitry to latch address signals provided on address input connections; and
      a trim set register having a plurality of individual trim settings, each trim setting comprising a program trim value and a step-up trim value.

26. The memory module of claim 25, and further comprising:
   a second trim set register having a plurality of individual trim settings, each trim setting comprising a sensing time value, a bitline precharge voltage value, and a sensing voltage value.

27. A memory module, comprising:
   a housing having a plurality of contacts; and
   one or more memory devices enclosed in the housing and selectively coupled to the plurality of contacts;
   wherein at least one of the memory devices comprises:
      an array of non-volatile memory cells;
      circuitry for control and/or access of the array of non-volatile memory cells;
      address circuitry to latch address signals provided on address input connections; and
      a trim set register having a plurality of individual trim settings, each trim setting comprising a program trim value and a step-up trim value.

28. The memory module of claim 27, and further comprising:
   a second trim set register having a plurality of individual trim settings, each trim setting comprising a sensing time value, a bitline precharge voltage value, and a sensing voltage value.

29. A memory module, comprising:
   a plurality of contacts; and
   two or more memory devices, each having access lines selectively coupled to the plurality of contacts;
   wherein at least one of the memory devices comprises:
      an array of memory cells;

control circuitry to read, write and erase the memory cells;

address circuitry to latch address signals provided on address input connections; and a trim set register having a plurality of individual trim settings, each trim setting comprising a program trim value and a step-up trim value.

30. The memory module of claim 29, and further comprising:

a second trim set register having a plurality of individual trim settings, each trim setting comprising a sensing time value, a bitline precharge voltage value, and a sensing voltage value.

31. A memory module, comprising:

a housing having a plurality of contacts; and one or more memory devices enclosed in the housing and selectively coupled to the plurality of contacts;

wherein at least one of the memory devices comprises:

an array of memory cells;

control circuitry to read, write and erase the memory cells;

address circuitry to latch address signals provided on address input connections; and a trim set register having a plurality of individual trim settings, each trim setting comprising a program trim value and a step-up trim value.

32. The memory module of claim 31, and further comprising:

a second trim set register having a plurality of individual trim settings, each trim setting comprising a sensing time value, a bitline precharge voltage value, and a sensing voltage value.

33. An electronic system, comprising:

a processor; and one or more memory device coupled to the processor, wherein at least one of the memory devices comprises:

an array of non-volatile memory cells;

circuitry for control and/or access of the array of non-volatile memory cells;

address circuitry to latch address signals provided on address input connections; and a trim set register having a plurality of individual trim settings, each trim setting comprising a program trim value and a step-up trim value.

34. The electronic system of claim 33, and further comprising:

a second trim set register having a plurality of individual trim settings, each trim setting comprising a sensing time value, a bitline precharge voltage value, and a sensing voltage value.

35. An electronic system, comprising:

a processor; and one or more memory device coupled to the processor, wherein at least one of the memory devices comprises:

an array of memory cells;

control circuitry to read, write and erase the memory cells;

address circuitry to latch address signals provided on address input connections; and a trim set register having a plurality of individual trim settings, each trim setting comprising a program trim value and a step-up trim value.

36. The electronic system of claim 35, and further comprising:

a second trim set register having a plurality of individual trim settings, each trim setting comprising a sensing time value, a bitline precharge voltage value, and a sensing voltage value.

* * * * *

UNITED STATES PATENT AND TRADEMARK OFFICE
CERTIFICATE OF CORRECTION

| | | |
|---|---|---|
| PATENT NO. | : 7,580,287 B2 | Page 1 of 1 |
| APPLICATION NO. | : 11/218851 | |
| DATED | : August 25, 2009 | |
| INVENTOR(S) | : Seiichi Aritome | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 461 days.

Signed and Sealed this

Fourteenth Day of September, 2010

David J. Kappos
*Director of the United States Patent and Trademark Office*